United States Patent [19]

Brewer et al.

[11] Patent Number: 4,950,583

[45] Date of Patent: Aug. 21, 1990

[54] ADHESION PROMOTING PRODUCT AND PROCESS FOR TREATING AN INTEGRATED CIRCUIT SUBSTRATE THEREWITH

[75] Inventors: Terry Brewer, Rolla; Tony D. Flaim, St. James; Mary G. Moss, Rolla, all of Mo.

[73] Assignee: Brewer Science Inc., Rolla, Mo.

[21] Appl. No.: 908,360

[22] Filed: Sep. 17, 1986

[51] Int. Cl.$^5$ .............................................. G03C 5/00
[52] U.S. Cl. .................................... 430/311; 430/272; 430/327; 437/229; 106/287.13
[58] Field of Search ............... 430/327, 270, 272, 935, 430/311; 437/229; 427/96; 106/287.13

[56] References Cited

U.S. PATENT DOCUMENTS

| | | | |
|---|---|---|---|
| 3,788,895 | 1/1974 | Schimmer et al. | 437/244 |
| 4,497,890 | 2/1985 | Helbert | 430/296 |
| 4,587,203 | 5/1986 | Brault et al. | 430/325 |
| 4,732,858 | 3/1988 | Brewer et al. | 437/228 |
| 4,783,391 | 11/1988 | Ohbayashi et al. | 430/196 |
| 4,865,649 | 9/1989 | Kashiwagi et al. | 106/287.16 |

FOREIGN PATENT DOCUMENTS

| | | | |
|---|---|---|---|
| 138490 | 11/1979 | Fed. Rep. of Germany | 427/96 |
| 00425 | 1/1986 | PCT Int'l Appl. | 430/296 |

*Primary Examiner*—Jose Dees
*Attorney, Agent, or Firm*—Edward H. Renner

[57] ABSTRACT

An improved method of promoting the adhesion of microelectronic coatings to substrates uses new adhesion promoters, catalysts for adhesion promoters and adjuvant polymers.

22 Claims, No Drawings

ADHESION PROMOTING PRODUCT AND PROCESS FOR TREATING AN INTEGRATED CIRCUIT SUBSTRATE THEREWITH

BACKGROUND AND SUMMARY OF THE INVENTION

This invention relates to adhesion promoters for integrated circuit substrates and the like and to improved method of treating integrated circuit substrates such as aluminum, silicon, silicon dioxide, silicon nitride and the like. In particular the invention relates to methods employing organosilane compounds in order to improve the adhesion of a photoresist layer applied to a substrate.

Applicants are aware of U.S. Pat. Nos. 3,788,895; 3,827,908; 4,103,045 and 4,529,618. The disclosures of these patents are incorporated by reference herein.

In a photolithograhpic process, such as that used to make integrated circuit components and the like, a patterned photoresist is formed on a substrate and the pattern is etched into the substrate. One of the difficulties that occurs in this type of process is caused by unsatisfactory adhesion of the photoresist to the substrate. As the structures and patterns which are produced in the integrated circuit component become smaller, the problem caused by lack of adhesion becomes greater. Typically, the lack of adhesion results in intrusion of the developing solution (wet process) into the pattern during the wet etch step of the process. As a result, some of the pattern may be lifted off of the substrate and the resulting structure formed in the substrate does not have the desired circuitry. The desired circuitry may also be etched off in subsequent processing steps, such as developing.

In order to improve the adhesion of the photoresist layers, substrates such as silicon, silicon dioxide, silicon nitride and aluminum are treated with adhesion promoters or primers. Currently used primers or adhesion promoters of choice are silazanes and silanes, such as chlorosilanes, and aminoalkoxy silanes. This last group, the aminoalkoxysilanes, is especially effective with photoresist and, with silazanes, is accepted as standard by the industry. However, the aminoalkoxy silanes do have some draw backs, particularly when the structure to be produced in an integrated circuit component is at or below the one micron size. Conventional materials normally require a fairly high level of addition in order to achieve satisfactory adhesion. These materials are added from an aqueous solution containing from about 0.25 to 3% by weight or from organic solutions at higher levels. Applicants' adhesion promoters have greatly superior bond, particularly under adverse etching conditions and where the formed structure is of one micron or less in dimension.

Applicants have discovered a new class of adhesion promoting compounds which are effective at very low addition levels, for example, applicants' adhesion promoters may be added from solutions containing 0.1 weight percent or less. Moreover, applicants' adhesion promoters have greatly superior bond, particularly under adverse etching conditions and where the formed structure is of one micron or less in dimension.

Further, applicants have discovered that the adhesion promoting properties of adhesion promoting compounds may be improved significantly by adding a suitable catalyst, such as an acid or base, to the adhesion promoter. This improvement is observed both with applicants' novel adhesion promoting compounds and with coventional compounds.

Further, applicants have found that the adhesion promoting characteristic of silane adhesion promoting compounds may be further improved by the addition of an adhesion promoting polymer to the adhesion promoting composition.

DESCRIPTION OF THE PREFERRED EMBODIMENTS

Applicants' have discovered a group of novel trialkoxyorganosilanes which are adhesion promoters. These silanes have conventional lower alkoxy substituents, such as methoxy and ethoxy, and may have conventional alkyl substituents, but the new compounds are not conventional amino alkoxy silanes or silazanes. With the exception of applicants' newly discovered amino phenyl alkoxy silanes, applicants' compounds are best described as non amino alkoxy silanes. Applicants' silanes can be applied at a much lower level to the substrate surface and yet can provide additional adhesion to a photoresist. Applicants' improved adhesion promoter layer allows one to directly overlay photoresist over the adhesion promoting layer without the necessity of baking the adhesion promoting layer. The elimination of this separate curing step for the adhesion promoter can provide a considerable time saving in processes of producing microelectronic components.

Applicants' newly discovered adhesion promoters, with the exception of applicants' newly discovered amino phenyl silanes, are non amino silanes. In addition to aminophenyl silanes, applicants' silanes include aromatic silanes, phenyl silanes, heterocyclic silanes, N-heterocyclic silanes, acrylic silanes, chloro silanes, and mercapto silanes. In particular, N-heterocyclic silanes have exceptional adhesion promoting properties.

As a further improvement applicants have discovered that catalysts may be added to organosilanes as a means of increasing or improving bonding performance. Catalysts are not always necessary for obtaining suitable activity, but their use typically speeds hydrolysis and results in better adhesion under harsh processing conditions. Applicants have discovered that basic compositions such as ammonia and water soluble organic amines are effective catalyst as are soluble carboxylic acids, sulfonic acids and those mineral acids which do not introduce undesirable anions, such as sulfuric or nitric. The nature of the catalysts used to get maximum activity varies somewhat with the particular organosilane. Applicants have discovered that typically one catalyst type, either acidic or basic, will obtain the greatest increase in performance from each particular organosilane. But generally both types result in improved adhesion performance.

Applicants have further found that the performance of silane adhesion promoters can also be enhanced by utilizing a polymer adjuvant with the adhesion promoter. Organosilanes are susceptable to a number of defects. Surface bound organosilane layers are susceptible to hydrolysis by alkaline solutions, in many cases, and spincoatings of photoresist or other coatings can disturb the integrity of the organosilane film resulting in weak spots and thin spots on the substrate. These effects are especially prevalent if the organosilane films are not baked prior to resist application.

Applicants have discovered that these difficulties can be remedied by applying an organosilane adhesion promoter containing a suitable polymer. These polymers have two important effects, first they reduce the susceptibility of the organosilane to hydrolysis, possibly by lowering the overall hydrophilicity of the adhesion promoting layer. This lessens the ability of alkaline developers to intercalate the promoter layer, which may be a critical problem particularly when the pendant organofunctionality of the silane is highly polar. Secondly, the polymer can increase the structural integrity of the promoter layer before it is baked, allowing the direct application of photoresist or other coatings over the polymer adhesion promoter layer and the elimination of the separate curing step for the adhesion promoter. This results in a considerable time saving. Of course, the polymer containing adhesion promoters may also be baked if increased adhesion is desired, for example, at 110–140° C. for 15–30 minutes prior to photoresist or polyimide spin coating.

Applicants have discovered that a wide range of polymers are effective when combined with organosilanes to improve the performance of these compounds as adhesion promoters. These polymers include carbohydrate polymers, such as cellulose polymers, cellulose ethers, methyl cellulose, ethyl cellulose and similar polysaccharide polymers, polyalkyl amines, e.g., polyethyleneimine, polycarboxylic acids, polyalcohols and polyglycol polymers. Both water soluble and water insoluble polymers from these materials are effective as adjuvents. The activity of the polymers in combination with the organosilane varies somewhat depending on the organofunctionality of the silane and addition of a particular polymer may result in only modest improvement with a particular organosilane with highly improved results being obtained in the case of the other silane polymer combinations.

A basic composition for applicants' adhesion promoter is

| Constituent | Weight % |
| --- | --- |
| Aqueous solvent | to balance |
| Polymer (optional) | 0–1.0, pref 0.05–0.5 |
| Organosilane | 0.05–0.5 |
| Catalyst (optional) | 0–0.1, pref 0.05–0.1 |

The invention may be more completely understood by reference to the following examples.

Example 1

The following composition has proven useful for improving the adhesion of positive photoresist to substrates, such as silicon and silicon nitride.

| Component | Weight % |
| --- | --- |
| Methacryloxypropyltrimethoxysilane | 0.10% |
| 50/50/0.1, v/v/v, isopropanol/water/ethanolamine | 99.90% |

Example 2

The following composition has proven useful for improving the adhesion of positive photoresist to substrates, such as silicon nitride.

| Component | Weight % |
| --- | --- |
| Phenyltriethoxysilane | 0.10% |
| 95/5/0.1, v/v/v, isopropanol/water/ethanolamine | 99.90% |

Example 3

Same proportions as Example 1, but the organosilane is N-(trimethoxysilyl-propyl) 4, 5-dihydro imidazole. [4,5-dihydro-1-(3-(triethoxysilyl)propyl)-1H imidazole] This composition has proven to be a highly effective enhancer of adhesion on silicon, silicon nitride, silicon dioxide, and aluminum substrates.

Example 4

Same proportions as Example 3, but the organosilane is p-aminophenyl-triethoxysilane.

Example 5

Same proportions as Example 3, but the organosilane is beta-trimethoxy- silylethyl-2-pyridine.

Example 6

Same proportions as Example 3, but the organosilane is (aminoethylamino- methyl) phenethyltrimethoxysilane.

Example 7

The following composition has proven useful for improving the adhesion of positive photoresist to substrates, such as aluminum.

| Component | Weight % |
| --- | --- |
| 3-Mercaptopropyltrimethoxysilane | 0.10% |
| 50/50/0.1, v/v/v/, isopropanol/water/acetic acid | 99.90% |

Example 8

Same proportions as Example 7, but the organosilane is 3-chloropropyltri- ethoxysilane.

Example 9

The following composition has proved especially useful for improving the adhesion of positive photoresist and polyimide to silicon, silicon nitride, silicon dioxide, and aluminized substrates. In comparison to the same composition prepared without polymer or to traditional hexamethyldisilazane treatments, it has shown a greater ability to reduce adhesion loss under standardized soaking test conditions when the adhesion promoters were not baked before the coating was applied.

| Component | Weight % |
| --- | --- |
| 3-Aminopropyltriethoxysilane | 0.10% |
| Methyl cellulose (D.S. 1.8) | 2.0% |
| 50/50, v/v, water/isopropanol | 99.70% |

Example 10

The following trialkoxyorganosilane/polymer combination showed improved ability to reduce adhesion loss of positive photoresist on silicon nitride in comparison to the analogous product without added polymer.

| Component | Weight % |
| --- | --- |
| N-trimethoxysilylpropylimidazole | 0.10% |
| Methyl cellulose (D.S. 1.8) | 0.11% |
| 50/50/0.1, v/v/v, isopropanol/water/ethanolamine | 99.79% |

Example 11

The following combination reduced adhesion loss of positive photoresist on aluminum to a greater extent than the analogous composition prepared without polymer. The promoters were baked before photoresist application.

| Component | Weight % |
| --- | --- |
| 3-Mercaptopropyltrimethoxysilane | 0.10% |
| Methyl cellulose (D.S. 1.8) | 0.20% |
| 50/50/0.1, v/v/v, isopropanol/water/acetic acid | 99.70% |

Example 12

The following formulation showed improved adhesion promotion capacity for positive photoresist on an aluminum substrate in comparison to a similar composition which did not contain polymer. The promoters were baked before resist application.

| Component | Weight % |
| --- | --- |
| 3-Mercaptopropyltrimethoxysilane | 0.10% |
| Polymethylvinylether/maleic anhydride, half isopropyl ester (copolymer) | 0.20% |
| 50/50/0.1, v/v/v, isopropanol/water/acetic acid | 99.70% |

Example 13

This formulation reduced the adhesion loss of positive photoresist on a silicon substrate to a greater extent than the corresponding formulation which contained no polymer. The promoters were not baked prior to resist spincoating.

| Component | Weight % |
| --- | --- |
| 3-Glycidoxypropyltrimethoxysilane | 0.10% |
| Polyethyleneimine | 0.20% |
| 50/50/0.1, v/v/v, ispropanol/water/ethanolamine | 99.70% |

Example 14

The formulation below improved the adhesion of positive photoresist to an aluminum substrate to a greater extent than the same composition without added polymer. The promoter films were baked before resist application.

| Component | Weight % |
| --- | --- |
| N-2-Aminoethyl-3-aminopropyl-trimethoxylsilane | 0.10% |
| Methyl cellulose (D.S. 1.8) | 0.20% |
| 50/50/0.1, v/v/v, isopropanol/water/ethanolamine | 99.70% |

Example 15

As an example of how polymeric additives may not improve the performance of all possible systems, the following catalysed system showed greater adhesion without incorporation of the polymer. The promoter films were baked before resist application.

| Component | Weight % |
| --- | --- |
| p-Aminophenyltriethoxysilane | 0.10% |
| Methyl cellulose (D.S. 1.8) (comparison) | 0.20% |
| 50/50/0.1, v/v/v, isopropanol/water/ethanolamine | 99.70% |

The parameters of these examples where all tested by allowing the adhesion promoter solution to age at least 24 hours before treating test substrates. Testing was performed as follows for photoresist on silicon, silicon dioxide, and silicon nitride substrates:

1. The adhesion promoter is spincoated at 5000 RPM for 30 seconds.
2. As an optional step, the applied adhesion promoter is hotplate baked for 30 seconds at 115° C.
3. Next, novolac/quinone diazide-type photoresist is applied and softbaked on a hotplate for 30 seconds at 115° C.
4. The photoresist is exposed by contact printing (75 mJ/cm$^2$), using a parallel stripe mask of linewidth of four millimeters.
5. The photoresist is then patterned in an alkaline developer, preferably a tetramethylammonium hydroxide system.
6. After patterning, the coated substrates are immersed in a room temperature solution of 95/5,v/v, water/methyl ethyl ketone to induce adhesion loss.
7. One test substrate is removed each hour (i.e. two replicates would be needed for a two hour test), dipped into 0.1M sodium hydroxide for ten seconds, and then rinsed with water and blown dry with nitrogen. A visual assignment of the percent pattern lost is made. Normally, soak testing should extend for five hours.

For positive photoresist on aluminized substrates:
1. The test method is essentially identical to that above, except that wafers are first carbon contaminated to enhance adhesion loss. This involves dipping each substrate into 0.50 weight percent aqueous sucrose, air drying, and then heating to 190° C. for 10 minutes to give a uniform film of oxidized carbon on the surface.

For polyimides on the substrates mentioned above:
1. The coating process is similar to that for photoresist except that the polyamic acid precursor solutions are spincoated 60 seconds at 5000 RPM an then oven baked, first at 90° C. for 30 minutes, and second at 148° C. for 30 minutes. Photoresist is applied over the polyimide, using the spinning conditions given in the first section, and softbaked for 30 minutes at 90° C. in a convection oven. The photoresist acts as a template for patterning the polyimide during development.
2. After patterning the photoresist/polyimide, the substrates are placed in 0.1M sodium hydroxide to produce adhesion loss of the polyimide. Normally, four replicates are needed to test the effects of 15, 30, 45 and 60 second exposure. Adhesion loss is assigned at each interval.

It will be appreciated by those skilled in the art that numerous modifications of applicants' invention may be made without departing from applicants' concept. Applicants' specific embodiments herein are given for purposes of illustration; the invention is to be limited only by the scope of the appended claims and their equivalents.

We claim:

1. In a method of producing microelectronic components by photolithography the improvement comprising applying an adhesion promoting alkoxysilane to a microelectronic component substrate, the adhesion promoting alkoxy silane being selected from the group consisting of p-aminophenyltriethoxysilane; beta-trimethoxysilylethyl-2-pyridine; 4,5-dihydro-1-(3-(triethoxysilyl)propyl)-1H-imidazole, and (aminoethylaminomethyl)phenylethyltrimethoxysilane, the adhesion promoter being effective to increase the bond of a microelectronic coating to the substrate.

2. The method of claim 1 wherein the adhesion promoter is p-aminophenyltriethoxysilane.

3. The method of claim 1 wherein the adhesion promoter is beta-trimethoxysilylethyl-2pyridine.

4. The method of claim 1 wherein the adhesion promoter is 4,5-dihydro-1(3-triethoxysilyl)propyl)-1H imidazole.

5. The method of claim 1 wherein the adhesion promoter is (aminoethylaminomethyl)phenylethyltrimethoxysilane.

6. In a method of producing microelectronic components by photolithography the improvement comprising applying an adhesion promoter to the microelectronic component substrate, the adhesion promoter comprising an adhesion promoting alkoxy silane and an activating catalyst, the catalyst being selected from the group consisting of acidic catalysts and basic catalysts, the catalyst being effective to increase the bonding of the alkoxy silane and the combination being effective to increase the bond of a microelectronic coating to the substrate.

7. The method of claim 6 wherein the catalyst is selected from the group consisting of ammonia, water soluble amines, carboxylic acids, sulfonic acids and mineral acids, the catalyst being effective to increase the bonding of, alkoxy silane adhesion promoters and being free of inhibiting and deleterious constituents including anions destructive to microelectronic circuitry.

8. The method of claim 6 wherein the catalyst is ethanolamine.

9. The method of claim 6 wherein the catalyst is acetic acid.

10. In a method of producing microelectronic components by photolithography the improvement comprising applying an adhesion promoter to a microelectronic substrate, the adhesion promoter comprising an adhesion promoting alkoxy silane and an adjuvant polymer, the polymer being effective when combined with the alkoxy silane to increase the activity of the alkoxy silane and the combination being effective to increase the bond of a microelectronic coating to the substrate.

11. The method of claim 10 wherein the adjuvant polymer is selected from the group consisting of polycarbohydrate polymers, polyalkylamine polymers, polycarboxylic acid polymers, polyalcohol polymers, polyglycol polymers and copolymers and mixtures thereof, the polymer being effective to increase the bond of the alkoxy silane and the combination being effective to increase the bond of a microelectronic coating to the substrate, the combination being effective to bond a microelectronic coating to a substrate without baking the adhesion promoter on the substrate.

12. The method of claim 10 wherein the adjuvant polymer is polyethyleneimine.

13. The method of claim 10 wherein the adjuvant polymer is methyl cellulose.

14. The method of claim 10 wherein the adjuvant polymer is polymethylvinylether/maleic anhydride half isopropyl ester copolymer.

15. In a method of producing microelectronic components by photolithography the improvement comprising applying an adhesion promoting alkoxy silane to a microelectronic component substrate, the adhesion promoting alkoxy silane being applied to the microelectronic substrate as a solution, the solution containing between about 0.05–0.5 weight percent alkoxy silane, an adjuvant polymer, the polymer being effective when combined with the alkoxy silane to increase the activity of the alkoxy silane, an adhesion promoting catalyst, the catalyst being effective to increase the bonding of the alkoxy silane and an aqueous solvent, the combination being effective to increase the bond of a microelectronic coating to the substrate.

16. The method of claim 15 wherein the solution contains between about 0.05–0.5 weight percent of an adjuvant polymer.

17. The method of claim 15 wherein the solution contains between about 0.05–0.1 weight percent catalyst.

18. The method of claim 15 wherein the adjuvant polymer is selected from the group consisting of polycarbonate polymers, polyalkylamine polymers, polycarboxylic acid polymers, polyalcohol polymers, polyglycol polymers and copolymers and mixtures thereof.

19. The method of claim 23 wherein the catalyst is selected from the group consisting of ammonia, water soluble amines, carboxylic acids, sulfonic acids and mineral acids, the catalyst being effective to increase the bonding of the alkoxy silane adhesion promoter and being free of inhibiting and deleterious constituents including anions destructive to microelectronic circuitry.

20. An adhesion promoter for bonding microelectronic coatings to a substrate to produce microelectronic components comprising a solution of an adhesion promoting alkoxy silane containing between about 0.05–0.5 weight percent alkoxy silane, an adjuvant polymer, the polymer being effective when combined with the alkoxy silane to increase the activity of the alkoxy silane, and an adhesion promoting catalyst, the catalyst being effective to increase the bonding of the alkoxy silane and the combination being effective to increase the bond of a microelectronic coating to a substrate.

21. The adhesion promoter of claim 20 wherein the catalyst is selected from the group consisting of ammonia, water soluble amines, carboxylic acids, sulfonic acids and mineral acids, the catalyst being effective to increase the bonding of alkoxy silane adhesion promoters and being free of inhibiting and deleterious constituents including anions destructive to microelectronic circuitry.

22. The adhesion promoter of claim 20 wherein the adjuvant polymer is selected from the group consisting of polycarbohydrate polymers, polyalkylamine polymers, polycarboxylic acid polymers, polyalcohol polymers, polyglycol polymers and copolymers and mixtures thereof.

* * * * *

UNITED STATES PATENT AND TRADEMARK OFFICE
CERTIFICATE OF CORRECTION

PATENT NO. : 4,950,583

DATED : August 21, 1990

INVENTOR(S) : Brewer et al.

It is certified that error appears in the above-identified patent and that said Letters Patent is hereby corrected as shown below:

Column 2, line 46, change "catalyst" to --catalysts--

Column 2, line 49, change "catalysts" to --catalyst--

Column 7, line 11, change "alkoxysilane" to --alkoxy silane--

Column 7, line 44, delete "," after --of--

Column 8, line 35, change "23" to --15--

Signed and Sealed this

Seventeenth Day of December, 1991

Attest:

HARRY F. MANBECK, JR.

*Attesting Officer*     *Commissioner of Patents and Trademarks*